United States Patent
Tang

(10) Patent No.: US 10,134,783 B2
(45) Date of Patent: Nov. 20, 2018

(54) BLUE PHASE LIQUID CRYSTAL DISPLAY PANEL AND METHOD FOR MANUFACTURING THE SAME

(71) Applicant: Wuhan China Star Optoelectronics Technology Co., Ltd., Wuhan, Hubei (CN)

(72) Inventor: Yuejun Tang, Hubei (CN)

(73) Assignee: WUHAN CHINA STAR OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 14/785,999

(22) PCT Filed: Jun. 26, 2015

(86) PCT No.: PCT/CN2015/082532
§ 371 (c)(1),
(2) Date: Dec. 13, 2016

(87) PCT Pub. No.: WO2016/197419
PCT Pub. Date: Dec. 15, 2016

(65) Prior Publication Data
US 2017/0153518 A1    Jun. 1, 2017

(30) Foreign Application Priority Data

Jun. 12, 2015 (CN) .......................... 2015 1 0324333

(51) Int. Cl.
*H01L 27/12* (2006.01)
*G02F 1/1335* (2006.01)
(Continued)

(52) U.S. Cl.
CPC ...... *H01L 27/1262* (2013.01); *G02F 1/13306* (2013.01); *G02F 1/13394* (2013.01);
(Continued)

(58) Field of Classification Search
CPC ......... G02F 1/134363; G02F 1/133512; G02F 1/13394; G02F 1/0123; G02F 1/1343;
(Continued)

(56) References Cited

U.S. PATENT DOCUMENTS

| | | | |
|---|---|---|---|
| 7,298,445 B1* | 11/2007 | Choi | G02F 1/134336 349/139 |
| 2002/0024627 A1* | 2/2002 | Sakamoto | G02F 1/134363 349/141 |

(Continued)

FOREIGN PATENT DOCUMENTS

| | | |
|---|---|---|
| CN | 101943829 | 1/2011 |
| CN | 101976005 | 2/2011 |

(Continued)

OTHER PUBLICATIONS

Search report and Written Opinion, dated Mar. 23, 2016, for International Application No. PCT/CN2015/082532.

*Primary Examiner* — Edward Glick
*Assistant Examiner* — Shan Liu
(74) *Attorney, Agent, or Firm* — Kim Winston LLP

(57) ABSTRACT

A blue phase liquid crystal display panel and a method for manufacturing the same are disclosed. The blue phase liquid crystal display panel comprises a lower substrate and an upper substrate. A horizontal electric field between the two substrates can be strengthened while a vertical electric field between the two substrates can be weakened through arranging a pixel electrode and a common electrode on the upper substrate and the lower substrate as well as a first fringe electric field and a second fringe electric field generated therein respectively, so that a driving voltage of the blue phase liquid crystal can be reduced.

2 Claims, 4 Drawing Sheets

(51) Int. Cl.
*G02F 1/133* (2006.01)
*G02F 1/1339* (2006.01)
*G02F 1/1343* (2006.01)
*G02F 1/1333* (2006.01)

(52) U.S. Cl.
CPC .... *G02F 1/13439* (2013.01); *G02F 1/133345* (2013.01); *G02F 1/133512* (2013.01); *G02F 1/134363* (2013.01); *G02F 2001/13396* (2013.01); *G02F 2001/13398* (2013.01); *G02F 2001/134372* (2013.01); *G02F 2201/121* (2013.01); *G02F 2201/122* (2013.01); *G02F 2201/123* (2013.01)

(58) Field of Classification Search
CPC ........... G02F 1/134309; G02F 1/13439; G02F 1/136286; G02F 1/155; G02F 1/1393; G02F 1/1395; G02F 1/136; G02F 1/218; G02F 1/134327; G02F 1/133707; G02F 1/134336; G02F 1/0316; G02F 2001/134318; G02F 2001/134372; G02F 2001/134381; G02F 2001/134345; G02F 2001/1357; G02F 2001/136218; G02F 2001/136295; G02F 2001/1552; G02F 2001/1555; G02F 2001/1557; G02F 2001/13629; G02F 2201/12; G02F 2201/121; G02F 2201/124; G02F 2201/122; G02F 2201/123; G02F 2201/14; G02F 1/0107; G02F 1/1339; G02F 1/13392; G02F 1/161; G02F 1/133377; G02F 2001/13396; G02F 1/133345; G02F 1/13306; G02F 2001/13398; G09G 2300/0495; G09G 2300/06; G09G 2300/0866; G09G 3/2944; G09G 3/3659; H01L 27/124; H01L 27/3276; H01L 27/3297; H01L 27/3279; H01L 27/329; H01L 27/1214; H01L 27/1262; H01L 23/49534; H01L 2933/0016
USPC ..................... 349/33–34, 139–148, 155–157
See application file for complete search history.

(56) References Cited

U.S. PATENT DOCUMENTS

| | | | |
|---|---|---|---|
| 2004/0263749 A1* | 12/2004 | Jeong | G02F 1/134363 349/141 |
| 2008/0129901 A1* | 6/2008 | You | G02F 1/13718 349/33 |
| 2008/0151133 A1* | 6/2008 | Kim | G02F 1/13338 349/12 |
| 2010/0225608 A1* | 9/2010 | Zhou | G02F 1/13338 345/173 |
| 2011/0007260 A1 | 1/2011 | Chien et al. | |
| 2011/0075074 A1* | 3/2011 | Gauza | C09K 19/0275 349/96 |
| 2012/0133878 A1* | 5/2012 | Hirakata | G02F 1/133528 349/141 |
| 2013/0148062 A1* | 6/2013 | Liang | G02F 1/133512 349/110 |
| 2014/0049742 A1* | 2/2014 | Misono | G02F 1/1339 349/153 |
| 2014/0127840 A1* | 5/2014 | Baek | G02F 1/13394 438/28 |
| 2016/0033798 A1* | 2/2016 | Choi | G02F 1/133512 349/110 |
| 2016/0306210 A1* | 10/2016 | Oh | G02F 1/13394 |

FOREIGN PATENT DOCUMENTS

| | | |
|---|---|---|
| CN | 102162955 | 8/2011 |
| CN | 103064219 | 4/2013 |
| CN | 103293791 | 9/2013 |

\* cited by examiner

BLUE PHASE LIQUID CRYSTAL DISPLAY PANEL AND METHOD FOR MANUFACTURING THE SAME

CROSS REFERENCE TO RELATED APPLICATION

The present application claims benefit of Chinese patent application CN 201510324333.4, entitled "Blue Phase Liquid Crystal Display Panel and Method for Manufacturing the Same" and filed on Jun. 12, 2015, the entirety of which is incorporated herein by reference.

FIELD OF THE INVENTION

The present disclosure relates to the technical field of liquid crystal display device, and particularly to a blue phase liquid crystal display panel and a method for manufacturing the same.

BACKGROUND OF THE INVENTION

In recent years, with the in-depth research into liquid crystal display technology, the advantages of blue phase liquid crystal have obtained more and more acknowledgements. Compared with the liquid crystal materials that are widely used at present, the blue phase liquid crystal has the prominent advantages of a fast response speed, a wide viewing angle, and free of alignment treatment. At the same time, however, the problem of over high driving voltage faced by the blue phase liquid crystal has seriously restricted its development. With respect to this problem, the driving voltage of the blue phase liquid crystal is reduced through improving the performance of the blue phase liquid crystal material or optimizing the structure of the driving electrode of the blue phase liquid crystal display device at present in the industry.

The performance of the blue phase liquid crystal material can be improved mainly through improving the manufacturing procedure of the material, so that the blue phase liquid crystal material with a large Kerr constant can be obtained. However, since the process of synthesizing blue phase liquid crystal material is rather complex, for example, the factors of monomer, photoinitiator, synthesis condition, etc should be taken into consideration when the blue phase liquid crystal of stable polymer is manufactured, the research and development cost thereof is very high.

The blue phase liquid crystal display device is mainly driven in an In-Plane Switching (IPS) mode. Therefore, optimizing the structure of the driving electrode mainly refers to strengthening the electric field strength in horizontal direction which is generated by the transparent insulation electrodes that are in parallel with each other through increasing the height of the electrode or changing the shape of the electrode. For example, the electrode can be wedge-shaped, wave-shaped, trapezoid-shaped, and so on. However, the manufacturing difficulty of the aforesaid electrodes is rather high, and thus it is difficult to guarantee the quality of the electrodes. Consequently, the qualified rate of the product is reduced.

In a word, in order to solve the aforesaid technical problem, a method through which the driving voltage of the blue phase liquid crystal can be reduced effectively is urgently needed.

SUMMARY OF THE INVENTION

The present disclosure aims to provide a method through which the driving voltage of the blue phase liquid crystal can be reduced effectively.

In order to solve the aforesaid technical problem, the embodiment of the present disclosure first provides a blue phase liquid crystal display panel, comprising a lower substrate and an upper substrate, wherein said lower substrate is provided with a first common electrode and a first pixel electrode, said first common electrode and said first pixel electrode generating a distributed first fringe electric field; wherein said upper substrate is provided with a second common electrode and a second pixel electrode that are arranged symmetrically with respect to said first common electrode and said first pixel electrode respectively, said second common electrode and said second pixel electrode generating a distributed second fringe electric field; and wherein the first fringe electric field and the second fringe electric field are configured so that a vertical electric field component of said first fringe electric field and that of said second fringe electric field are mutually weakened, while a horizontal electric field component of said first fringe electric field and that of said second fringe electric field are mutually strengthened.

Preferably, the display panel further comprises a substrate control module that is arranged on at least one of the substrates and a signal synchronization module, wherein said substrate control module is used for controlling a loading of a driving voltage signal of a pixel electrode, and said signal synchronization module is used for synchronizing said driving voltage signal.

Preferably, said signal synchronization module comprises a plurality of connecting electrodes that are arranged on said upper substrate and a plurality of extending electrodes that are arranged on said lower substrate, each of said connecting electrodes being connected with a corresponding extending electrode.

Preferably, said extending electrodes are arranged in a non-active area outside pixel units of said lower substrate, and said connecting electrodes are arranged on said upper substrate at positions corresponding to said extending electrodes.

Preferably, a number of said extending electrodes is equal to a number of the pixel units of the lower substrate.

Preferably, said connecting electrodes each comprise a core in form of a truncated cone, and a conductor layer that is coated on an outer surface of said core.

Preferably, a material of said core comprises an elastic material.

The embodiment of the present disclosure further provides a method for manufacturing a blue phase liquid crystal display panel, comprising the following steps: forming a first common electrode on a prefabricated lower substrate through patterning; coating said first common electrode with a first insulation layer; and forming a first pixel electrode on said first insulation layer through patterning, and synchronously forming extending electrodes in a non-active area outside pixel units of said lower substrate through patterning.

In another respect, the present disclosure further provides a method for manufacturing a blue phase liquid crystal display panel, comprising the following steps: forming a second common electrode on a prefabricated upper substrate through patterning; coating said second common electrode with a second insulation layer; forming a spacer on said second insulation layer through patterning, and synchronously forming cores of connecting electrodes at positions corresponding to extending electrodes through patterning; and forming a second pixel electrode on said second insulation layer through patterning, and synchronously forming conductor layers of the connecting electrodes at outer surfaces of the cores of said connecting electrodes through patterning.

Preferably, the step of forming a spacer on said second insulation layer through patterning, and synchronously forming cores of connecting electrodes at positions corresponding to extending electrodes through patterning further comprises the following sub-steps: coating the insulation layer having been washed with a material layer that is used for forming a primary spacer, a secondary spacer, and connecting electrodes and a photoresist layer in sequence; exposing and developing said photoresist layer with a triple tone photomask; etching part of the material layer and ashing part of the photoresist layer, so that the material layer is bare in an area for forming the secondary spacer and areas for forming the connecting electrodes; etching a bare material layer so as to form a secondary spacer, and forming the cores of the connecting electrodes that have a height of the secondary spacer at the same time; and removing residual photoresist and forming a primary spacer.

Compared with the prior art, one embodiment or a plurality of embodiments according to the present disclosure may have the following advantages or beneficial effects.

According to the present disclosure, through arranging a pixel electrode and a common electrode on the upper substrate and the lower substrate respectively, the electric field in horizontal direction between the two substrates can be strengthened, while the electric field in vertical direction between the two substrates can be weakened, so that the driving voltage of the blue phase liquid crystal can be reduced.

Other advantages, objectives, and features of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art, and constitute one part of the description. The drawings are used for interpreting the present disclosure together with the embodiments, not for limiting the present disclosure. In the drawings:

FIG. 1(a) and FIG. 1(b) schematically show structures of a blue phase liquid crystal display panel according to an embodiment of the present disclosure, wherein FIG. 1(a) is a front view of the blue phase liquid crystal display panel, and FIG. 1(b) is a top view of an upper substrate and a lower substrate of the blue phase liquid crystal display panel;

FIG. 6(a) and FIG. 6(b) are flow charts of methods for manufacturing the blue phase liquid crystal display panel according to the embodiment of the present disclosure, wherein FIG. 6(a) is a flow chart of a method for manufacturing a lower substrate, and FIG. 6(b) is a flow chart of a method for manufacturing an upper substrate.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Figure 1A:
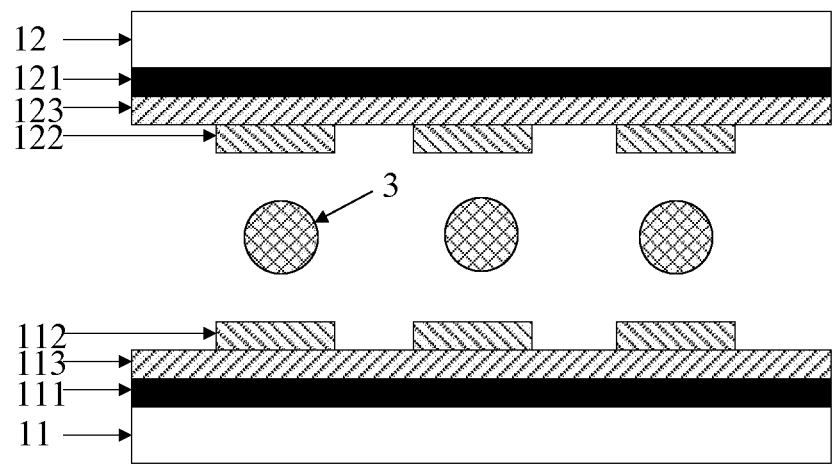

According to an embodiment of the present disclosure, electrodes are arranged on a lower substrate 11 and an upper substrate 12 of a liquid crystal display panel in a mirror symmetrical manner, as shown in FIG. 1(a), which is a front view of the blue phase liquid crystal display panel. The lower substrate 11 is provided with a first common electrode 111 and a first pixel electrode 112, and the upper substrate 12 is provided with a second common electrode 121 and a second pixel electrode 122. The common electrodes 111 and 121 as well as the pixel electrodes 112 and 122 are all arranged in parallel with the substrate. In addition, an insulation layer 113 is arranged between the first common electrode 111 and the first pixel electrode 112, and an insulation layer 123 is arranged between the second common electrode 121 and the second pixel electrode 122. Reference number 3 in FIG. 1(a) represents blue phase liquid crystal molecules filled between the two substrates. The lower substrate 11 in FIG. 1(a) corresponds to an array substrate of a Liquid Crystal Display (LCD), and the upper substrate 12 corresponds to a color filter substrate of a LCD. In general, the color filter substrate is provided with a black matrix, a color filter array, a transparent electrode (a common electrode), etc. The above structures would not have effect on the specific implementations of the present disclosure, and thus the structures are not shown in FIG. 1(a).

Figure 1B:
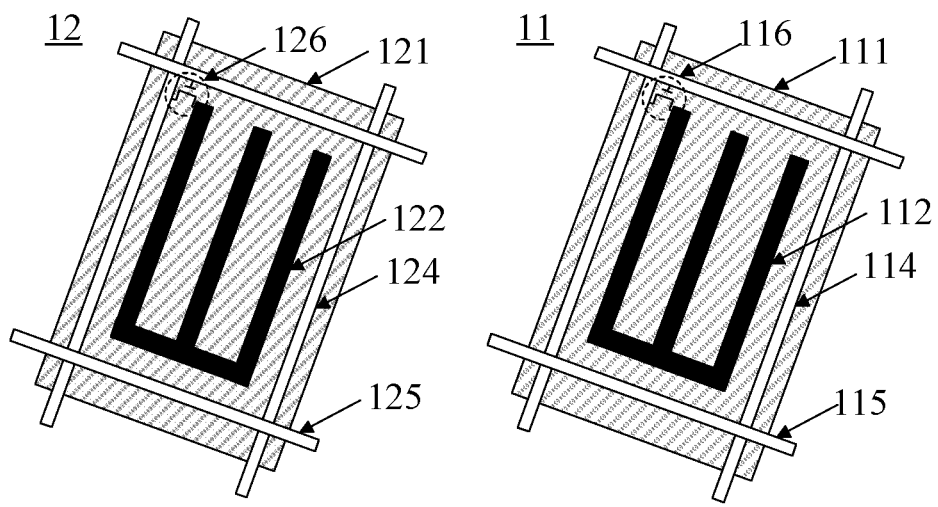

Further, according to the embodiment of the present disclosure, in order to drive the pixel electrodes that are arranged on the upper substrate and the lower substrate respectively, the upper substrate and the lower substrate are provided with a group of substrate control modules respectively, as shown in FIG. 1(b). FIG. 1(b) is a top view of the upper substrate and the lower substrate of the blue phase liquid crystal display panel. The lower substrate 11 is provided with a lower substrate control module (which mainly comprises a plurality of data lines 114, a plurality of scanning lines 115, and a plurality of switching elements 116 that are arranged in a plurality of pixel units formed by the data lines and scanning lines which are configured orthogonally to each other), and the upper substrate 12 is provided with an upper substrate control module (which mainly comprises a plurality of data lines 124, a plurality of scanning lines 125, and a plurality of switching elements 126 that are arranged in a plurality of pixel units formed by the data lines and scanning lines which are configured orthogonally to each other). The upper substrate control module and the lower substrate control module are used for controlling a loading of a driving voltage signal of a pixel electrode of the upper substrate and a loading of a driving voltage signal of a pixel electrode of the lower substrate respectively. In addition, the display panel is further provided with a signal synchronization module which is used for synchronizing driving voltage signals of the pixel electrodes of the upper substrate and the lower substrate. The signal synchronization module is not shown in FIG. 1(b).

A first fringe electric field can be generated and distributed between the first common electrode 111 and the first pixel electrode 112 under the common effect of the upper substrate control module, the lower substrate control module, and the signal synchronization module. Similarly, a second fringe electric field can be generated and distributed between the second common electrode 121 and the second pixel electrode 122 since the same arrangement therebetween. The blue phase liquid crystal molecules near the pixel electrodes can be rotated by the fringe electric fields, and thus the penetration of the liquid crystal display panel and the viewing angle thereof can both be improved.

Figure 2:
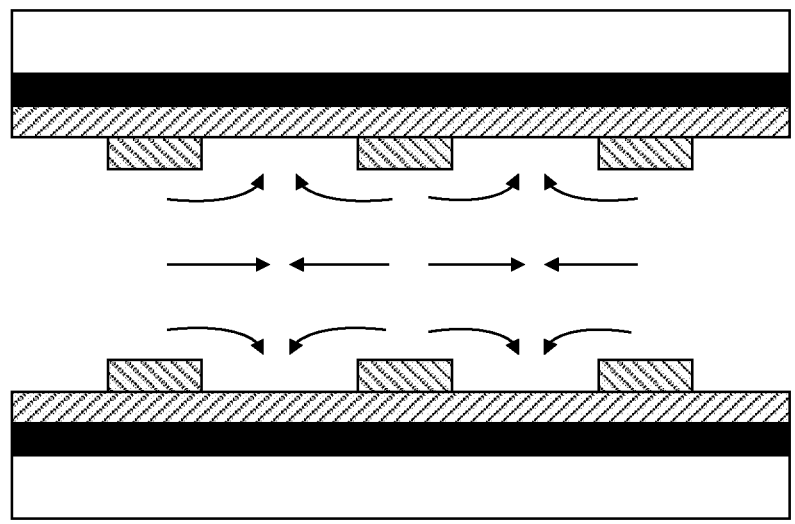
FIG. 2 schematically shows an electric field distribution between the two substrates of the blue phase liquid crystal display panel according to the embodiment of the present disclosure.

According to the embodiment of the present disclosure, the vertical electric field component between the two substrates can be weakened, while the horizontal electric field component between the two substrates can be strengthened by the electrode arrangement mode, as shown in FIG. 2. FIG. 2 schematically shows an electric field distribution between the two substrates of the blue phase liquid crystal display panel according to the embodiment of the present disclosure. Since the first common electrode and the second common electrode are arranged mirror symmetrically, and the first pixel electrode and the second pixel electrode are arranged mirror symmetrically, the horizontal electric field component of the distributed first fringe electric field that is generated by the first common electrode and the first pixel electrode and the horizontal electric field component of the distributed second fringe electric field that is generated by the second common electrode and the second pixel electrode are the same as each other in magnitude and in direction. Therefore, the horizontal electric field component between the two substrates can be strengthened when the aforesaid two horizontal electric field components are superposed with each other in space, as shown by the electric field lines represented by the solid lines in FIG. 2. The vertical electric field component between the two substrates is composed of two parts, wherein one part is the vertical electric field component of the distributed fringe electric field generated by the first (the second) common electrode and the first (the second) pixel electrode, and the other part is the vertical electric field component of the electric field generated by the first (the second) common electrode and the second (the first) pixel electrode. The vertical electric field component between the two substrates can be weakened after the aforesaid vertical electric field components are superposed with one another in space.

Therefore, the electric field in vertical direction between the two substrates can be weakened, while the electric field in horizontal direction between the two substrates can be strengthened by the superposition of the first fringe electric field and the second fringe electric field, wherein the superposition of the vertical electric field components further comprises the superposition of the vertical electric field component of the electric field generated by the first (the second) common electrode and the second (the first) pixel electrode). Tus the driving voltage of the blue phase liquid crystal display panel can be reduced.

It should be noted that, according to the embodiment of the present disclosure, the specific structures of the common electrode and the pixel electrode are not restricted, as long as an effective fringe electric field can be generated between the common electrode and the pixel electrode. For example, when the pixel electrode has a comb shape, the common electrode can also have a corresponding comb shape. In this case, the electric fields in vertical direction between the first (the second) pixel electrode and the first (the second) common electrode as well as between the first (the second) pixel electrode and the second (the first) common electrode can be weakened, and thus the efficiency of the liquid crystal can be improved. The details of which are no longer repeated here.

Figure 3:
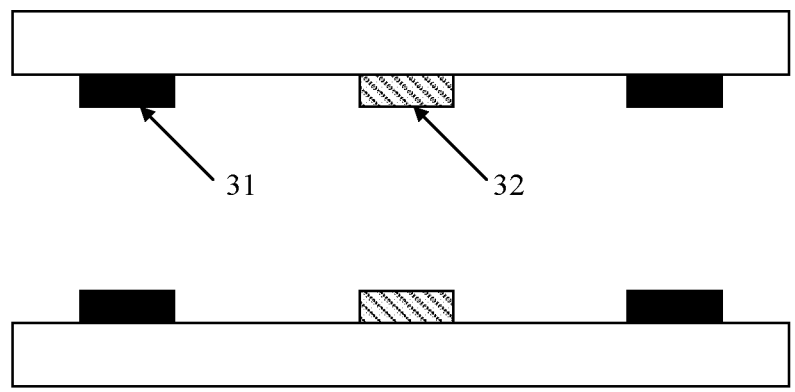
FIG. 3 schematically shows the electrode arrangement of the blue phase liquid crystal display panel according to the embodiment of the present disclosure.

Further, the electrodes on the upper substrate and the lower substrate each can be arranged to be an IPS electrode, as shown in FIG. 3. FIG. 3 schematically shows the electrode arrangement of the blue phase liquid crystal display panel according to the embodiment of the present disclosure, wherein reference number 31 indicates a pixel electrode (or common electrode), and reference number 32 indicates a corresponding common electrode (or pixel electrode). The pixel electrodes and the common electrodes are applied with different driving signals respectively, and therefore the electric fields which are mutually strengthened in horizontal direction while mutually weakened in vertical direction can be generated between the upper substrate and the lower substrate. In this case, the driving voltage of the blue phase liquid crystal display panel can be reduced.

According to another embodiment of the present disclosure, the signal synchronization module is configured to comprise a plurality of connecting units. Each connecting unit is composed of a connecting electrode and an extending electrode, and is used for connecting the second pixel electrode of the upper substrate and the first pixel electrode of the lower substrate. In this case, the pixel electrodes of the upper substrate and the lower substrate can be controlled by the switching element that is arranged on one of the two substrates, so that the first pixel electrode and the second pixel electrode can be driven synchronously. Therefore, not only the driving voltage of the blue phase liquid crystal can be reduced, but also one substrate control module can be saved and the manufacturing procedures thereof can be simplified. The details thereof will be illustrated below with reference to FIG. 4 and FIG. 5.

Figure 4:
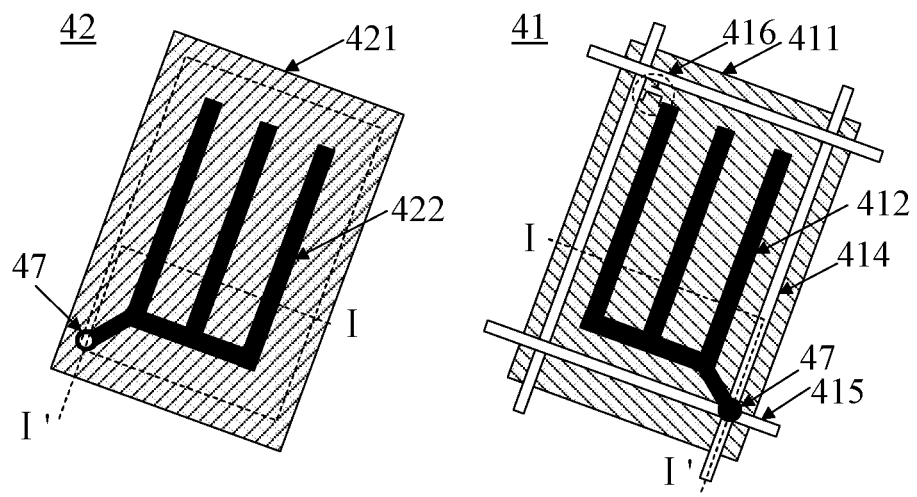
FIG. 4 is a top view of a blue phase liquid crystal display panel according to another embodiment of the present disclosure.

FIG. 4 is a top view of a blue phase liquid crystal display panel according to another embodiment of the present disclosure. Specifically, reference number 42 indicates an upper substrate, which corresponds to a color filter substrate, and reference number 41 indicates a lower substrate, which corresponds to an array substrate. The arrangement of pixel electrodes and common electrodes of the upper substrate and the lower substrate is the same as that of the previous embodiment. The display panel comprises a first common electrode 411, a first pixel electrode 412, a second common electrode 421, a second pixel electrode 422, and a data line 414, a scanning line 415, and a switching element 416 that are arranged on the lower substrate, and the details of which are no longer repeated here. It can be further seen from FIG. 4 that, the upper substrate 42 is not provided with an upper substrate control module that is composed of data line, scanning line, switching element, etc. At the same time, part of a signal synchronization module 47 is arranged on the upper substrate in an area corresponding to a pixel unit of the lower substrate (i.e., the area surrounded by the rectangular dotted line box as shown in FIG. 4). The complete structure of the signal synchronization module is shown in FIG. 5.

Figure 5:
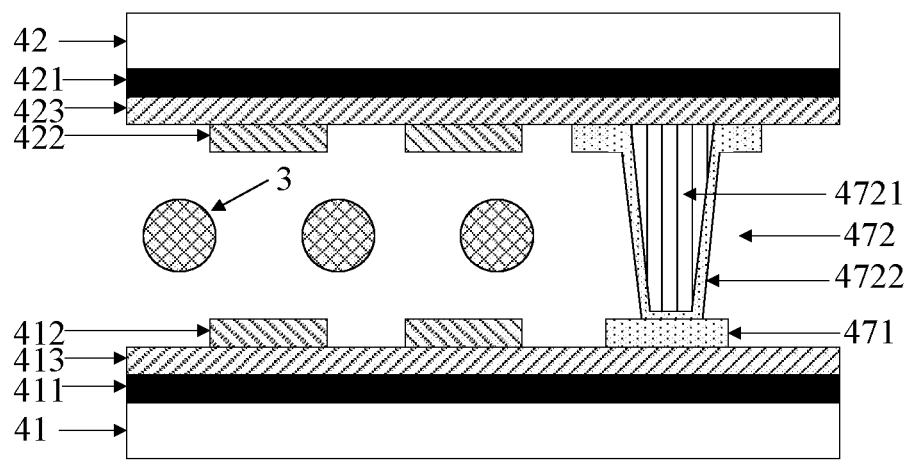
FIG. 5 is a sectional view of a cell that is composed of the upper substrate and the lower substrate as shown in FIG. 4 along line I-I'.

FIG. 5 is a sectional view of a cell that is composed of the upper substrate and the lower substrate as shown in FIG. 4 along line I-I'. Specifically, the signal synchronization module 47 comprises a plurality of connecting electrodes 472 that are arranged on the upper substrate and a plurality of extending electrodes 471 that are arranged on the lower substrate. It can be seen from FIG. 5 that, the connecting electrode 472 and the extending electrode 471 can be connected with each other after the upper substrate and the lower substrate are assembled into a liquid crystal cell. Thus the pixel electrodes of the two substrates can be controlled simultaneously by the switching element that is arranged on one of the two substrates (according to the embodiment of the present disclosure, the switching element is arranged on the lower substrate). Further, the connecting electrode 472 comprises a core 4721 and a conductor layer 4722 that is coated on an outer surface of the core.

As shown in FIG. 5, the core 4721 is shaped as a truncated cone, which would facilitate the coating of the conductor layer 4722 thereon. The material of the core is generally selected to be an elastic material, such as ultraviolet (UV) hardened acrylic resin. The material of the conductor layer can be the same as that of the pixel electrode, such as Indium Tin Oxide (ITO). The structure with an elastic core therein enables the connecting electrode to have certain compressibility, so that the pixel electrodes of the two substrates can be connected effectively through the connecting electrodes and the extending electrodes.

It should be noted that, a plurality of spacers which can play the role of supporting are arranged between the upper substrate and the lower substrate of the liquid crystal display panel, comprising primary spacers and secondary spacers. The primary spacers play the main role of supporting so as to maintain a gap between the two substrates, i.e., maintain the thickness of the liquid crystal cell. The secondary spacers play the auxiliary role of supporting so as to prevent the liquid crystal panel from being destroyed by outside pressing. In general, a height of the primary spacer is larger than a height of the secondary spacer. In addition, the primary spacer has a relatively small density, while the secondary spacer has a relatively large density. According to the embodiment of the present disclosure, the connecting electrodes are distributed among the primary spacers and the secondary spacers, and a height of the connecting electrode (the height of the connecting electrode referred to hereinafter means a total height including a thickness of the extending electrode) is larger than the height of the secondary spacer while less than the height of the primary spacer. Moreover, a total size of the connecting electrode is less than a size of the primary spacer, so that a density of the connecting electrode can be reduced, and a performance of the primary spacer would not be affected. The total size of the connecting electrode mainly refers to a height of the column and a diameter of the top surface (or bottom surface) of the column.

Meanwhile, in order to guarantee that the connecting electrode can abut against the substrate on the opposite side after the display panel is assembled, the connecting electrode should have a certain compression amount. The compression amount is preferably ranges from 0.01 µm to 0.5 µm, or from 0.01 µm to 0.2 µm. For example, if the height of the primary spacer is designed to be 3 µm, and the height of the secondary spacer is designed to be 2.6 µm, the height of the connecting electrode can be arranged in a range from 2.5 µm (i.e., 3 µm-0.5 µm) to 2.99 µm (i.e., 3 µm-0.01 µm).

Further, the number of the connecting units incorporated in the signal synchronization module is equal to the number of the pixel units of the lower substrate, and the signal synchronization module is arranged in a non-active area outside the pixel units of the lower substrate. Specifically, each pixel unit is provided with a connecting unit. The extending electrodes can be arranged on data lines or scanning lines of the lower substrate, can be arranged at intersection positions of data lines and scanning lines of the lower substrate (as shown in FIG. 4), or can be arranged at positions corresponding to black matrixes of the upper substrate, and the connecting electrodes are arranged on the upper substrate at positions corresponding to the extending electrodes. Since the signal synchronization module does not occupy an active area of the pixel unit, the signal synchronization module would not influence the display effect of the liquid crystal display panel.

Of course, the position of the connecting electrode and the position of the extending electrode can be interchanged with each other, i.e., the connecting electrode can be arranged on the lower substrate, and the extending electrode arranged on the upper substrate. The embodiment of the present disclosure can also be realized in this manner.

In the signal synchronization module according to the embodiment of the present disclosure, the pixel electrodes of the two substrates can be connected through the cooperation of the connecting electrodes and the extending electrodes, so that the pixel electrodes of the two substrates can be controlled synchronously by the switching element that is arranged on one of the two substrates. In this manner, the substrate control module can be arranged only on one of the two substrates, and thus the manufacturing procedure of the other substrate can be simplified. At the same time, the connecting electrodes can play the role of supporting, so that the assembled liquid crystal display panel can have a higher mechanical strength.

Figure 6A:
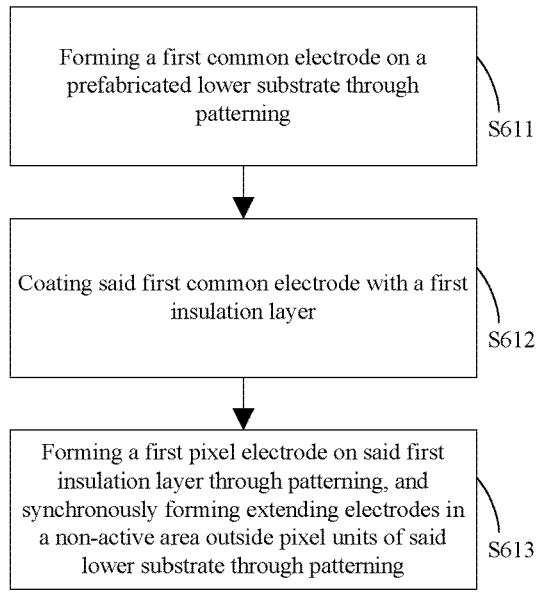
Figure 6B:
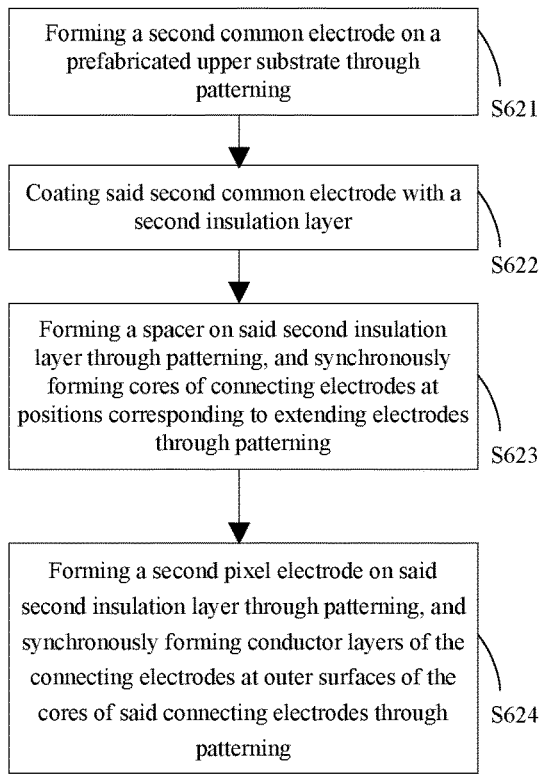

The embodiment of the present disclosure further provides a method for manufacturing the aforesaid liquid crystal display panel, as shown in FIGS. 6(a) and 6(b). FIG. 6(a) and FIG. 6(b) are flow charts of methods for manufacturing the blue phase liquid crystal display panel according to the embodiment of the present disclosure, wherein FIG. 6(a) is a flow chart of a method for manufacturing a lower substrate, and FIG. 6(b) is a flow chart of a method for manufacturing an upper substrate.

As shown in FIG. 6(a), the method for manufacturing the lower substrate comprises the following steps. In step S611, a first common electrode is formed on a prefabricated lower substrate through patterning. In step S612, the first common electrode is coated with a first insulation layer. And in step S613, a first pixel electrode is formed on the first insulation layer through patterning, and synchronously extending electrodes are formed in a non-active area outside pixel units of the lower substrate through patterning.

Specifically, the prefabricated lower substrate generally refers to an array substrate on which a gate of a Thin Film Transistor (TFT), a scanning line, and a common line are formed. Since the above structures can all be manufactured through known procedures, and the manufacturing procedures would not affect the specific implementations of the embodiment of the present disclosure, the details of which are no longer repeated here.

The first common electrode is connected with the common line. The step of forming a first common electrode on a prefabricated lower substrate through patterning can further comprise the sub steps of sputtering, photolithography, etc according to the structure of the first common electrode. For example, if the first common electrode is an integral planar electrode, it can be formed through sputtering deposition procedure. If the first common electrode has a specific shape, such as a comb shape, the pattern of the first common electrode should be formed through photolithography treatment after the deposition procedure. The patterning procedure specifically comprises the steps of washing, filming, photoresist coating, exposing, developing, etching, photoresist stripping, and so on, and the above steps can all be performed according to the method for manufacturing the substrate in the prior art.

The first insulation layer is made at the same time as a gate insulation layer of the TFT. The insulation layer can be made of SiNx through Chemical Vapor Deposition (CVD) technology.

Then, a semiconductor layer, a source, and a drain of the TFT, as well as a passivation layer which covers the TFT are manufactured in sequence according to known procedures. Next, the first pixel electrode and the extending electrode are formed through patterning synchronously. The extending electrodes are arranged in a non-active area outside the pixel units of the lower substrate. The extending electrodes can be formed on data lines or scanning lines, at intersection positions of data lines and scanning lines, or at positions corresponding to black matrixes of the upper substrate by photomasks with different shapes.

As shown in FIG. 6(b), the method for manufacturing the upper substrate comprises the following steps. In step S621, a second common electrode is formed on a prefabricated upper substrate through patterning. In step S622, the second common electrode is coated with a second insulation layer. In step S623, a spacer is formed on the second insulation layer through patterning, and synchronously cores of connecting electrodes are formed at positions corresponding to extending electrodes through patterning. And in step S624, a second pixel electrode is formed on the second insulation layer through patterning, and synchronously conductor layers of the connecting electrodes are formed at outer surfaces of the cores of the connecting electrodes through patterning.

Specifically, the prefabricated upper substrate generally refers to a color filter substrate on which a black matrix layer and a color resistance layer are formed. Similarly, since the above structures can all be manufactured through known procedures, and the manufacturing procedures would not affect the specific implementations of the embodiment of the present disclosure, the details of which are no longer repeated here.

The second common electrode is connected with the common line. This procedure is roughly the same as the procedure of forming the first common electrode through patterning, which comprises the steps of washing, filming, photoresist coating, exposing, developing, etching, photoresist stripping, and so on. The above steps can all be performed according to the method for manufacturing the substrate already known in the prior art, and the details of which are no longer repeated here.

The second insulation layer is formed on the second common electrode, and can be made of SiNx through CVD technology.

The cores of the connecting electrodes, the primary spacers, and the secondary spacers are formed synchronously. The SiNx insulation layer that is washed is coated with a material that is used for forming the primary spacer, the secondary spacer, and the connecting electrodes, and a photoresist material in sequence, and the material layer of the spacers and the photoresist layer can be formed after the treatments of drying, pre-baking, and cooling.

A height of a primary spacer area, a height of a secondary spacer area, and a height of a connecting electrode area can be formed by a triple tone photomask. The triple tone photomask includes three areas with different values of transmissivity, wherein an area with a transmissivity of 100% is the area without a light shielding film, an area with a transmissivity of 0 is the area with a light shielding film, and an area with a transmissivity between 0 and 100% is the gray-scale area. The photoresist layer is exposed and developed in sequence with the triple tone photomask, and the photoresist layer after the above treatments comprises three areas.

The photoresist material of the first area is reserved completely and is used for forming the primary spacers. The photoresist material of the second area is reserved partly and is used for forming the secondary spacers and the connecting electrodes. The photoresist material of the third area is removed completely. Then, the residual photoresist material and the material layer of the spacers of the third area are removed through etching, and thus the pattern of each spacer area is formed initially.

The photoresist layer of other two areas is ashed, and the photoresist material of the second area is removed completely, so that the material layer which is used for forming the secondary spacer area and the connecting electrode layer is bare. The pattern of the secondary spacer area is further formed through etching. The height of the connecting electrodes arranged in the connecting electrode area is the same as the height of the secondary spacers arranged in the secondary spacer area.

The residual photoresist of the first area is removed, so that the pattern of the primary spacer area can be formed.

It should be noted that, according to the embodiment of the present disclosure, the connecting electrode is made of material the same as the material of the primary spacer and the secondary spacer. In general, resin material with elasticity is used, and the expansion coefficient of the material should be close to that of the blue phase liquid crystal. In this case, during the manufacturing of the display panel, the volumes of the connecting electrodes and the primary spacers can change with the liquid crystal within a certain range, and thus the qualified rate of the product can be improved. At the same time, the quality of the image of the LCD would not be affected when the display panel expands or shrinks under a high or a low temperature.

The second pixel electrode and the conductor layer of the connecting electrode can be formed synchronously, and the specific procedure is the same as the step of forming the second common electrode through patterning. The details of which are no longer repeated here. Since the connecting electrode has an inclining surface, during the sputtering deposition process, a metal layer (i.e., ITO layer) is formed uniformly on the inclining lateral surface of the connecting electrode, and is used for forming a channel between the first pixel electrode and the second pixel electrode. In general, the thickness of the pixel electrode ranges from 400 Å to 1500 Å. The thickness of the conductor layer that is formed on the core of the connecting electrode, plus the thickness of the extending electrode (which is equal to the thickness of the pixel electrode), and plus the height of the core of the spacer enables the height of the connecting electrode formed therein to be larger than the height of the secondary spacer while less than the height of the primary spacer.

According to the embodiment of the present disclosure, the connecting electrodes and the extending electrodes can be manufactured through changing part of the procedures based on the known manufacturing procedures, and the procedures are not increased to a large extent. The production line does not need to be rearranged, which would facilitate the saving of the production cost, the application popularization, and the quality control thereof.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A method for manufacturing a blue phase liquid crystal display panel, comprising the following steps:

forming a first common electrode on a prefabricated lower substrate through patterning;

coating said first common electrode with a first insulation layer;

forming a first pixel electrode on said first insulation layer through patterning, and synchronously forming extending electrodes in a non-active area outside pixel units of said lower substrate through patterning;

forming a second common electrode on a prefabricated upper substrate through patterning;

coating said second common electrode with a second insulation layer;

forming a spacer on said second insulation layer through patterning, and synchronously forming cores of connecting electrodes at positions corresponding to the extending electrodes through patterning; and forming a second pixel electrode on said second insulation layer through patterning, and synchronously forming conductor layers of the connecting electrodes at outer surfaces of the cores of said connecting electrodes through patterning, wherein the step of forming a spacer on said second insulation layer through patterning, and synchronously forming cores of connecting electrodes at positions corresponding to the extending electrodes through patterning further comprises the following sub-steps:

coating the second insulation layer having been washed with a material layer that is used for forming a primary spacer, a secondary spacer, and the connecting electrodes and a photoresist layer in sequence;

exposing and developing said photoresist layer with a triple tone photomask;

etching part of the material layer and ashing part of the photoresist layer, so that the material layer is bare in an area for forming the secondary spacer and areas for forming the connecting electrodes;

etching the bare part of the material layer so as to form the secondary spacer, and forming the cores of the connecting electrodes that have a height of the secondary spacer at the same time; and removing residual photoresist and forming the primary spacer.

2. A method for manufacturing a blue phase liquid crystal display panel, comprising the following steps:

forming a second common electrode on a prefabricated upper substrate through patterning;

coating said second common electrode with a second insulation layer;

forming a spacer on said second insulation layer through patterning, and synchronously forming cores of connecting electrodes at positions corresponding to extending electrodes through patterning; and forming a second pixel electrode on said second insulation layer through patterning, and synchronously forming conductor layers of the connecting electrodes at outer surfaces of the cores of said connecting electrodes through patterning, wherein the step of forming a spacer on said second insulation layer through patterning, and synchronously forming cores of connecting electrodes at positions corresponding to extending electrodes through patterning further comprises the following sub-steps:

coating the second insulation layer having been washed with a material layer that is used for forming a primary spacer, a secondary spacer, and the connecting electrodes and a photoresist layer in sequence;

exposing and developing said photoresist layer with a triple tone photomask;

etching part of the material layer and ashing part of the photoresist layer, so that the material layer is bare in an area for forming the secondary spacer and areas for forming the connecting electrodes;

etching the bare part of the material layer so as to form the secondary spacer, and forming the cores of the connecting electrodes that have a height of the secondary spacer at the same time; and removing residual photoresist and forming the primary spacer.

* * * * *